(12) United States Patent
Nakamura et al.

(10) Patent No.: US 8,211,327 B2
(45) Date of Patent: *Jul. 3, 2012

(54) PREPARATION OF RARE EARTH PERMANENT MAGNET MATERIAL

(75) Inventors: Hajime Nakamura, Echizen (JP); Koichi Hirota, Echizen (JP); Takehisa Minowa, Echizen (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 331 days.

This patent is subject to a terminal disclaimer.

(21) Appl. No.: 10/572,753

(22) PCT Filed: Mar. 22, 2005

(86) PCT No.: PCT/JP2005/005134
§ 371 (c)(1),
(2), (4) Date: Mar. 21, 2006

(87) PCT Pub. No.: WO2006/043348
PCT Pub. Date: Apr. 27, 2006

(65) Prior Publication Data
US 2008/0245442 A1    Oct. 9, 2008

(30) Foreign Application Priority Data
Oct. 19, 2004 (JP) .................. 2004-304543
Dec. 27, 2004 (JP) .................. 2004-377379

(51) Int. Cl.
C04B 35/04 (2006.01)
C04B 35/64 (2006.01)
C04B 35/40 (2006.01)
C04B 35/26 (2006.01)
H01F 1/00 (2006.01)
H01F 1/26 (2006.01)
H01F 1/04 (2006.01)
H01F 1/14 (2006.01)
B22F 3/00 (2006.01)

(52) U.S. Cl. .......... 252/62.54; 252/62.57; 252/62.58; 252/62.55

(58) Field of Classification Search ............. 252/62.57, 252/62.58, 62.54, 62.55
See application file for complete search history.

(56) References Cited

U.S. PATENT DOCUMENTS

| | | | |
|---|---|---|---|
| 4,859,255 A * | 8/1989 | Fujimura et al. | 148/302 |
| 5,034,146 A | 7/1991 | Ohashi et al. | |
| 5,194,099 A | 3/1993 | Esper | |
| 5,250,255 A * | 10/1993 | Sagawa et al. | 419/39 |
| 5,286,366 A * | 2/1994 | Mitsuji | 205/176 |
| 5,405,455 A | 4/1995 | Kusunoki et al. | |
| 5,411,603 A | 5/1995 | Vial et al. | |
| 5,766,372 A | 6/1998 | Fujimura et al. | |
| 5,858,124 A | 1/1999 | Endo et al. | |
| 6,296,720 B1 | 10/2001 | Yamamoto et al. | |
| 6,302,939 B1 | 10/2001 | Rabin et al. | |
| 6,606,019 B1 | 8/2003 | Ohashi | |
| 6,777,097 B2 * | 8/2004 | Hamada et al. | 428/469 |
| 6,960,240 B2 | 11/2005 | Hirota et al. | |
| 7,053,745 B2 | 5/2006 | Yoshimura et al. | |
| 2004/0187970 A1 | 9/2004 | Ishizaka et al. | |
| 2006/0278517 A1 | 12/2006 | Machida et al. | |
| 2007/0017601 A1 | 1/2007 | Miyata et al. | |
| 2007/0034299 A1 | 2/2007 | Machida et al. | |
| 2007/0240789 A1 | 10/2007 | Nakamura et al. | |
| 2008/0223489 A1 | 9/2008 | Nagata et al. | |
| 2008/0245442 A1 | 10/2008 | Nakamura et al. | |
| 2008/0247898 A1 | 10/2008 | Nakamura et al. | |
| 2009/0098006 A1 | 4/2009 | Nakamura et al. | |
| 2009/0226339 A1 * | 9/2009 | Nakamura et al. | 419/9 |

FOREIGN PATENT DOCUMENTS

| | | |
|---|---|---|
| EP | 0255939 A2 | 2/1988 |
| EP | 1643513 A1 | 4/2006 |
| EP | 1705668 A2 | 9/2006 |
| EP | 1705669 A2 | 9/2006 |
| EP | 1705670 A2 | 9/2006 |
| EP | 1705671 A2 | 9/2006 |
| EP | 1 830 371 A1 | 9/2007 |
| JO | 01-155603 A | 6/1989 |
| JP | 61-195954 A | 8/1986 |
| JP | 62-256412 A | 11/1987 |
| JP | 1-117303 A | 5/1989 |
| JP | 1-251704 A | 10/1989 |
| JP | 3-188241 A | 8/1991 |

(Continued)

OTHER PUBLICATIONS

Beeby. Micromachined silicon generator for harvesting power from vibrations. 4th int workshop on micro and nanotechnology for power generation and energy conversion applications (POWERMEMS 2004) Kyoto Japan.*

Gao. Effects of the degree of grain alignment on the hard magnetic properties of sintered NDFeB magnets. App. Phys A. 67, 353-356 (1998).*

K.-D. Durst et al.; "The Coercive Field of Sintered and Melt-Spun NdFeB Magnets", Journal of Magnetism and Magnetic Materials, 68 (1987), pp. 63-75.

(Continued)

Primary Examiner — Carol M Koslow
Assistant Examiner — Matthew Hoban (57) ABSTRACT

A method for preparing a rare earth permanent magnet material comprising the steps of:
disposing a powder comprising one or more members selected from an oxide of $R^2$, a fluoride of $R^3$, and an oxyfluoride of $R^4$ wherein $R^2$, $R^3$ and $R^4$ each are one or more elements selected from among rare earth elements inclusive of Y and Sc on a sintered magnet form of a $R^1$—Fe—B composition wherein $R^1$ is one or more elements selected from among rare earth elements inclusive of Y and Sc, and
heat treating the magnet form and the powder at a temperature equal to or below the sintering temperature of the magnet in vacuum or in an inert gas.

The invention offers a high performance, compact or thin permanent magnet having a high remanence and coercivity at a high productivity.

12 Claims, 3 Drawing Sheets

FOREIGN PATENT DOCUMENTS

| | | |
|---|---|---|
| JP | 4-184901 A | 7/1992 |
| JP | 04-328204 A | 11/1992 |
| JP | 4-328804 | 11/1992 |
| JP | 05-021218 A | 1/1993 |
| JP | 5-31807 | 5/1993 |
| JP | 6-158238 A | 6/1994 |
| JP | 6-244011 | 9/1994 |
| JP | 6-244011 A1 | 9/1994 |
| JP | 3143156 | 3/2001 |
| JP | 2003-282312 A | 10/2003 |
| JP | 3471876 B2 | 12/2003 |
| JP | 2004-296973 A | 10/2004 |
| JP | 2004-304038 A | 10/2004 |
| JP | 2005-11973 | 1/2005 |
| JP | 2005-285861 A | 10/2005 |
| JP | 2007-53351 A | 3/2007 |
| RU | 1 513 738 A1 | 4/1995 |
| RU | 2 136 068 C1 | 8/1999 |
| WO | WO 2004/114333 A1 | 12/2004 |
| WO | WO 2005/123974 A1 | 12/2005 |
| WO | WO 2006-003882 A1 | 1/2006 |
| WO | WO 2006-043348 A1 | 4/2006 |
| WO | WO 2007-119551 A1 | 10/2007 |

OTHER PUBLICATIONS

K. T. Park et al.; "Effect of Metal-Coating and Consecutive Heat Treatment on Coercivity of Thin Nd-Fe-B Sintered Magnets", Proceedings of the Sixteenth International Workshop on Rare-Earth Magnets and Their Applications, Sendai, (2000) pp. 257-264.

K. Machida et al.; "Grain Boundary Tailoring of Nd-Fe-B Sintered Magnets and Their Magnetic Properties", Proceedings of the 2004 Spring Meeting of the Powder & Powder Metallurgy Society, pp. 202.

International Search Report of PCT/JP2005/005134 dated Jul. 12, 2005.

International Search Report, dated Jun. 28, 2005, International Application No. PCT/JP2005/005134.

Translation of International Preliminary Report on Patentability mailed May 3, 2007 of International Application No. PCT/JP2005/005134.

The Journal of the Institute of Electrical Engineers of Japan, vol. 124, 2004, pp. 699-702, published on Nov. 1, 2004.

Press Release (Shin-Etsu News) dated on Mar. 24, 2005.

Intermag Asia 2005; Digest of the IEEE International Magnetics Conference; p. 476; held on Apr. 4-8, 2005.

Techno-Frontier Symposium 2005; pp. B1-2-1 to B1-2-12; held on Apr. 20, 2005 by JMA.

IEEE Transactions on Magnetics, vol. 41, No. 10. Oct. 2005, pp. 3844-3846.

Abstract of Autumn Meeting of Japan Society of Powder and Powder Metallurgy, 2005; p. 143; held on Nov. 14-16, 2005.

2005 BM Symposium, Abstract of Presentation by The Japan Association of Bonded Magnet Industries held on Dec. 2, 2005.

Hwang D. H. et al. "Development of High Coercive Powder From the Nd-Fe-B Sintered Magnet Scrap" IEEE Transactions on Magnetics, IEEE Service Center, New York, NY, US, vol. 40, No. 4, Jul. 2004, pp. 2877-2879.

Extended European Search Report dated Jan. 14, 2008 of European Application No. 06250542.5.

Machine Translation of JP 06-244011.

International Search Report of PCT/JP2007/056594, date of mailing Jul. 10, 2007.

International Search Report of PCT/JP2007/056586, date of mailing Jun. 19, 2007.

"Shin-Etsu Chemical develops new high-performance technology for neodymium rare-earth magnets", Shin-Etsu News, press release in Tokyo, Mar. 24, 2005.

Hajime Nakamura, "Nd-Fe-B Sintered Magnets Produced by the Grain Boundary Diffusion Process", Bulletin of Topical Symposium of the Magnetic Society of Japan, Mar. 14, 2006, pp. 13-18.

IEEE International Magnetics Conference, May 8-12, 2006, p. 910.

Digest of the 30$^{th}$ Annual Conference on Magnetics in Japan 2006, pp. 417-418.

European Search Report dated Jun. 4, 2008, issued in corresponding European Patent Application No. 07251603.2.

U.S. Appl. No. 11/916,498, filed Dec. 4, 2007 entitled Method for Preparing Rare Earth Permanent Magnet Material.

European Search Report dated Mar. 31, 2008, issued in corresponding European Patent Application No. 07254503.

Hirota, K. et al.; "Coercivity Enhancement by the Grain Boundary Diffusion Process to Nd-Fe-B Sintered Magnets"; IEEE Transactions on Magnetics, vol. 42, No. 10, pp. 2909-2911, XP002463459, Oct. 2006.

European Search Report dated Jun. 26, 2008, issued in corresponding European Patent Application No. 08250927.4.

Qin, C-D et al., "The protective coatings of NdFeB magnets by Al and Al(Fe)", Journal of Applied Physics, American Institute of Physics, vol. 79, No. 8, pp. 4854-4856, Apr. 15, 1996.

Russian Decision on Grant dated Mar. 18, 2009, issued in corresponding Russian patent application No. 2006117529/02.

The Nikkan Kogyo Shimbun, press release, Mar. 25, 2005.

The Dempa Shimbun, press release, Mar. 25, 2005.

The Kagaku Kogyo Nippo (The Chemical Daily), press release, Mar. 25, 2005.

The Sekiyu Kagaku Shimbun Nikkan Tsushin, press release, Mar. 25, 2005.

The Nikkan Chemical News, press release, Mar. 25, 2005.

Nikkei Net, press release, Mar. 24, 2005.

Kenichi Machida et al., "Grain Boundary Modification and Magnetic Properties of Nd-Fe-B Sintered Magnets"; Abstracts of Spring Meeting of Japan Society of Powder and Powder Metallurgy; 2004; 1-47A p. 1/2 and 202.

* cited by examiner

PREPARATION OF RARE EARTH PERMANENT MAGNET MATERIAL

TECHNICAL FIELD

This invention relates to a method for preparing a R—Fe—B system permanent magnet in which the coercive force of a sintered magnet form is enhanced while controlling a decline of its remanence; and more particularly, to a method for preparing a high performance, compact or thin rare earth permanent magnet material.

BACKGROUND ART

Nd—Fe—B system permanent magnets have a growing range of application due to their excellent magnetic properties. While electronic equipment having magnets built therein including computer-related equipment, hard disk drives, CD players, DVD players, and mobile phones are currently under the trend toward size and weight reductions, higher performance and energy saving, there exists a demand to enhance the performance of Nd—Fe—B magnets, especially compact or thin Nd—Fe—B sintered magnets.

Indexes for the performance of magnets include remanence (or residual magnetic flux density) and coercive force. An increase in the remanence of Nd—Fe—B sintered magnets can be achieved by increasing the volume factor of $Nd_2Fe_{14}B$ compound and improving the crystal orientation. To this end, a number of modifications have been made on the process. With respect to the increased coercive force, among different approaches including grain refinement, the use of alloy compositions with greater Nd contents, and the addition of effective elements, the currently most common approach is to use alloy compositions having Dy or Tb substituted for part of Nd. Substituting these elements for Nd in the $Nd_2Fe_{14}B$ compound increases both the anisotropic magnetic field and the coercive force of the compound. The substitution with Dy or Tb, on the other hand, reduces the saturation magnetic polarization of the compound. Therefore, as long as the above approach is taken to increase coercive force, a loss of remanence is unavoidable.

In Nd—Fe—B magnets, the coercive force is given by the magnitude of an external magnetic field which creates nuclei of reverse magnetic domains at grain boundaries. Formation of nuclei of reverse magnetic domains is largely dictated by the structure of the grain boundary in such a manner that any disorder of grain structure in proximity to the boundary invites a disturbance of magnetic structure, helping formation of reverse magnetic domains. It is generally believed that a magnetic structure extending from the grain boundary to a depth of about 5 nm contributes to an increase of coercive force (See non-patent reference 1). The inventors found that by concentrating trace Dy or Tb only in proximity to the grain boundaries to increase the anisotropic magnetic field only in proximity to the boundaries, the coercive force can be increased while suppressing significant decline of remanence (see patent reference 1). Subsequently, the inventors established a production method comprising separately preparing a $Nd_2Fe_{14}B$ compound composition alloy and a Dy or Tb-rich alloy, mixing them and sintering the mixture (see patent reference 2). In this method, the Dy or Tb-rich alloy becomes a liquid phase during the sintering and is distributed so as to surround the $Nd_2Fe_{14}B$ compound. As a consequence, substitution of Dy or Tb for Nd occurs only in proximity to grain boundaries in the compound, so that the coercive force can be effectively increased while suppressing significant decline of remanence.

However, since the two types of alloy fine powders in the mixed state are sintered at a temperature as high as 1,000 to 1,100° C., the above-described method has a likelihood that Dy or Tb diffuses not only to the boundaries, but also into the interior of $Nd_2Fe_{14}B$ grains. An observation of the microstructure of an actually produced magnet shows that Dy or Tb has diffused to a depth of about 1 to 2 μm from the boundary in a grain boundary surface layer, the diffused area reaching 60% or more when calculated as volume fraction. As the distance of diffusion into grains becomes longer, the concentration of Dy or Tb near the boundaries becomes lower. To positively suppress the excessive diffusion into grains, lowering the sintering temperature may be effective, but this measure cannot be practically acceptable because it compromises densification by sintering. An alternative method of sintering at lower temperatures while applying stresses by means of a hot press or the like enables densification, but poses the problem of extremely reduced productivity.

On the other hand, it is reported for small magnets that coercive force can be increased by applying Dy or Tb on the magnet surface by sputtering, and heat treating the magnet at a temperature lower than the sintering temperature, thereby causing Dy or Tb to diffuse only to grain boundaries (see non-patent references 2 and 3). This method allows for more effective concentration of Dy or Tb at the grain boundary and succeeds in increasing the coercive force without a substantial loss of remanence. As the magnet becomes larger in specific surface area, that is, the magnet form becomes smaller, the amount of Dy or Tb fed becomes larger, indicating that this method is applicable to only compact or thin magnets. However, there is still left the problem of poor productivity associated with the deposition of metal coating by sputtering or the like.

Patent reference 1: JP-B 5-31807
Patent reference 2: JP-A 5-21218
Non-patent reference 1: K. D. Durst and H. Kronmuller, "THE COERCIVE FIELD OF SINTERED AND MELT-SPUN NdFeB MAGNETS," Journal of Magnetism and Magnetic Materials, 68 (1987), 63-75
Non-patent reference 2: K. T. Park, K. Hiraga and M. Sagawa, "Effect of Metal-Coating and Consecutive Heat Treatment on Coercivity of Thin Nd—Fe—B Sintered Magnets," Proceedings of the Sixteen International Workshop on Rare-Earth Magnets and Their Applications, Sendai, p. 257 (2000)
Non-patent reference 3: K. Machida, H. Kawasaki, M. Ito and T. Horikawa, "Grain Boundary Tailoring of Nd—Fe—B Sintered Magnets and Their Magnetic Properties," Proceedings of the 2004 Spring Meeting of the Powder & Powder Metallurgy Society, p. 202

SUMMARY OF THE INVENTION

Problem to be Solved by the Invention

An object of the invention, which is made to solve the foregoing problems, is to provide a method for preparing a R—Fe—B sintered magnet having a high coercive force at a high productivity wherein R is one or more elements selected from among rare earth elements inclusive of Y and Sc.

Means for Solving the Problem

The inventors have discovered that when a $R^1$—Fe—B sintered magnet, typically a Nd—Fe—B sintered magnet is heated with a powder comprising one or more members selected from an oxide of $R^2$, a fluoride of $R^3$, and an oxyfluoride of $R^4$ wherein $R^2$, $R^3$ and $R^4$ each are one or more elements selected from among rare earth elements inclusive of Y and Sc being present in the magnet surface, $R^2$, $R^3$ or $R^4$ contained in the powder is absorbed in the magnet form whereby the coercive force is increased while significantly suppressing a decline of remanence. Particularly when a fluoride of $R^3$ or an oxyfluoride of $R^4$ is used, $R^3$ or $R^4$ is efficiently absorbed in the magnet along with fluorine, resulting in a sintered magnet having a high remanence and a high coercive force. The present invention is predicated on this discovery.

The present invention provides a method for preparing a rare earth permanent magnet material as defined below.

A first embodiment comprises a method for preparing a rare earth permanent magnet material comprising the steps of:

disposing a powder comprising an oxide of $R^2$, wherein $R^2$ is one or more elements selected from among rare earth elements inclusive of Y and Sc on a sintered magnet form of a $R^1$-Fe-B composition wherein $R^1$ is one or more elements selected from among rare earth elements inclusive of Y and Sc, said sintered magnet form having a dimension of at least 0.5 mm in a magnetic anisotropy direction, and heat treating the magnet form and the powder at a temperature equal to or below the sintering temperature of the magnet in vacuum or in an inert gas, wherein said powder comprising an oxide of $R^2$ having an average particle size of up to 100 μm is disposed in the surface of the magnet form as a slurry thereof dispersed in an aqueous or organic solvent.

A second embodiment comprises the method of the first embodiment, wherein the sintered magnet form to be heat treated has a shape having a dimension of up to 100 mm along its maximum side and a dimension of up to 10 mm in a magnetic anisotropy direction.

A third embodiment comprises the method of the first embodiment, wherein the powder comprising an oxide of $R^2$ is present in a magnet-surrounding space within a distance of 1 mm from the surface of the magnet form and at an average filling factor of at least 10%.

A fourth embodiment comprises the method of the first embodiment, wherein the powder comprising an oxide of $R^2$ has an average particle size of up to 100 μm.

A fifth embodiment comprises the method of the first embodiment, wherein $R^2$ contains at least 10 atom% of Dy and/or Tb.

A sixth embodiment comprises the method of the first embodiment, further comprising, after the heat treatment, effecting aging treatment at a temperature from 350° C. to a temperature lower than the temperature of the heat treatment.

A seventh embodiment comprises the method of the first embodiment, wherein the sintered magnet form is cleaned with at least one of alkalis, acids and organic solvents before the step of disposing the powder on the surface of the magnet form, and then effecting the heat treatment.

An eighth embodiment comprises the method of the first embodiment, wherein a surface layer of the sintered magnet form is removed by shot blasting before the step of disposing the powder on the surface of the magnet form, and then effecting the heat treatment.

A ninth embodiment comprises the method of the first embodiment, wherein cleaning with at least one of alkalis, acids and organic solvents, grinding, or plating or painting is carried out as a final treatment after the heat treatment.

A tenth embodiment comprises the method of the first embodiment, wherein said sintered magnet has a dimension of 4 to 100 mm along its maximum side.

An eleventh embodiment comprises the method of the first embodiment, wherein the sintered magnet form to be heat treated has a shape having a dimension of 0.5 to 10 mm in a magnetic anisotropy direction.

A twelfth embodiment comprises the method of the first embodiment, wherein the sintered magnet form to be heat treated is obtained by compacting and sintering powder of a mother alloy containing $R^1$, Fe and B, and machining the thus obtained sintered block to a shape having a dimension of 4 to 100 mm along its maximum side and a dimension of up to 10 mm in a magnetic anisotropy direction.

BENEFITS OF THE INVENTION

The present invention ensures that a high-performance permanent magnet, especially a compact or thin permanent magnet, having a high remanence and a high coercive force is manufactured at a high productivity.

BRIEF DESCRIPTION OF THE DRAWINGS

FIG. 2 includes (a) a reflection electron image under SEM, and (b) a Dy compositional image, (c) Nd compositional image, (d) F compositional image, and (e) O compositional image by EPMA of the magnet form M1 which is prepared by the invention.

BEST MODE FOR CARRYING OUT THE INVENTION

Now the invention will be described in more detail.

The invention pertains to a method for preparing a R—Fe—B sintered magnet material having a high remanence and coercive force.

In the method for preparing a rare earth permanent magnet material, an oxide, fluoride or oxyfluoride of a rare earth element is disposed on the surface of a sintered magnet form composed of $R^1$—Fe—B composition to effect heat treatment.

The R—Fe—B sintered magnet form may be obtained from a mother alloy in a conventional way by coarse pulverization, fine pulverization, compacting and sintering.

As used herein, R and $R^1$ each are selected from among rare earth elements inclusive of Y and Sc. R is mainly used for the magnet form obtained, and $R^1$ is mainly used for the starting material.

The mother alloy contains $R^1$, Fe, and B. $R^1$ represents one or more elements selected from among rare earth elements inclusive of Y and Sc, examples of which include Y, Sc, La, Ce, Pr, Nd, Sm, Eu, Gd, Tb, Dy, Ho, Er, Yb, and Lu. Preferably $R^1$ is mainly composed of Nd, Pr, and Dy. The rare earth elements inclusive of Y and Sc should preferably account for 10 to 15 atom %, especially 12 to 15 atom % of the entire alloy. More preferably, $R^1$ should contain either one or both of Nd and Pr in an amount of at least 10 atom %, especially at least 50 atom %. Boron should preferably account for 3 to 15 atom %, especially 4 to 8 atom % of the entire alloy. The alloy may further contain 0 to 11 atom %, especially 0.1 to 5 atom % of one or more elements selected from among Al, Cu, Zn, In, Si, P, S, Ti, V, Cr, Mn, Ni, Ga, Ge, Zr, Nb, Mo, Pd, Ag, Cd, Sn, Sb, Hf, Ta, and W. The balance consists of Fe and incidental impurities such as C, N and O. Iron should preferably account for at least 50 atom %, especially at least 65 atom % of the entire alloy. It is acceptable that Co substitutes for part of Fe, for example, 0 to 40 atom %, especially 0 to 15 atom % of Fe.

The mother alloy is obtained by melting the starting metals or alloys in vacuum or in an inert gas, preferably Ar atmosphere, and then pouring in a flat mold or book mold, or pouring as by strip casting. An alternative method, called binary alloys method, is also applicable wherein an alloy whose composition is approximate to the $R_2Fe_{14}B$ compound, the primary phase of the present alloy and an R-rich alloy serving as a liquid phase aid at the sintering temperature are separately prepared, crushed, weighed and admixed together. It is noted that since the alloy whose composition is approximate to the primary phase composition is likely to leave α—Fe depending on the cooling rate during the casting or the alloy composition, it is subjected to homogenizing treatment, if desired for the purpose of increasing the amount of $R_2Fe_{14}B$ compound phase. The homogenization is achievable by heat treatment in vacuum or in an Ar atmosphere at 700 to 1,200° C. for at least 1 hour. For the R-rich alloy serving as a liquid phase aid, not only the casting method described above, but also the so-called melt quenching method or strip casting method are applicable.

Furthermore, in the pulverizing step to be described below, at least one member selected from a carbide, nitride, oxide and hydroxide of $R^1$ or a mixture or composite thereof can be admixed with the alloy powder in an amount of 0.005 to 5% by weight.

The alloy is generally coarsely pulverized to a size of 0.05 to 3 mm, especially 0.05 to 1.5 mm. For the coarse pulverizing step, a Brown mill or hydriding pulverization is used, with the hydriding pulverization being preferred for the alloy prepared by strip casting. The coarse powder is then finely pulverized to a size of 0.2 to 30 μm, especially 0.5 to 20 μm, for example, on a jet mill using high pressure nitrogen.

The fine powder is compacted in a magnetic field by a compression molding machine and introduced into a sintering furnace. The sintering is carried out in vacuum or an inert gas atmosphere, typically at 900 to 1,250° C., especially 1,000 to 1,100° C.

The sintered magnet thus obtained contains 60 to 99% by volume, preferably 80 to 98% by volume of the tetragonal $R_2Fe_{14}B$ compound as the primary phase, with the balance being 0.5 to 20% by volume of an R-rich phase, 0 to 10% by volume of a B-rich phase, and at least one of carbides, nitrides, oxides and hydroxides resulting from incidental impurities or additives or a mixture or composite thereof.

The sintered block is machined into a preselected shape. Its size is not limited. In the practice of the invention, the shape should preferably have a dimension of up to 100 mm, preferably up to 50 mm, especially up to 20 mm along its maximum side and a dimension of up to 10 mm, preferably up to 5 mm, especially up to 2 mm in a magnetic anisotropy direction, for the reason that the amount of $R^2$, $R^3$ or $R^4$ absorbed ion the magnet form from the powder comprising one or more members selected from an oxide of $R^2$, a fluoride of $R^3$, and an oxyfluoride of $R^4$ disposed on the magnet surface becomes greater as the specific surface area of the magnet form is larger, that is, the dimensions thereof are smaller. More preferably, the dimension in a magnetic anisotropy direction should be up to 10 mm, preferably up to 5 mm, especially up to 1 mm.

The shape may have a dimension of at least 0.1 mm along its maximum side and a dimension of at least 0.05 mm in a magnetic anisotropy direction, although the invention is not limited thereto.

Disposed on the surface of the machined magnet form is a powder comprising one or more members selected from an oxide of $R^2$, a fluoride of $R^3$, and an oxyfluoride of $R^4$. It is noted that $R^2$, $R^3$ and $R^4$ each are one or more elements selected from among rare earth elements inclusive of Y and Sc and preferably contains at least 10 atom %, more preferably at least 20 atom %, most preferably at least 40 atom % of Dy or Tb.

In this case, it is preferred from the object of the present invention that in the powder comprising a fluoride of $R^3$ and/or an oxyfluoride of $R^4$, $R^3$ and/or $R^4$ contains at least 10 atom % of Dy and/or Tb, and the total concentration of Nd and Pr in $R^3$ and/or $R^4$ is lower than the total concentration of Nd and Pr in $R^1$.

For the reason that a more amount of $R^2$, $R^3$ or $R^4$ is absorbed as the filling factor of the powder in the magnet surface-surrounding space is higher, the filling factor should be at least 10% by volume, preferably at least 40% by volume, calculated as an average value in the magnet surrounding space from the magnet surface to a distance of 1 mm, in order for the invention to attain its effect.

One exemplary technique of disposing or applying the powder is by dispersing a fine powder comprising one or more members selected from an oxide of $R^2$, a fluoride of $R^3$, and an oxyfluoride of $R^4$ in water or an organic solvent to form a slurry, immersing the magnet form in the slurry, and drying in hot air or in vacuum or drying in the ambient air. Alternatively, the powder can be applied by spray coating or the like. Any such technique is characterized by ease of application and mass treatment.

The particle size of the fine powder affects the reactivity when the $R^2$, $R^3$ or $R^4$ component in the powder is absorbed in the magnet. Smaller particles offer a larger contact area that participates in the reaction. In order for the invention to attain its effect, the powder disposed around the magnet should desirably have an average particle size of up to 100 μm, preferably up to 10 μm. Although the lower limit is not restricted, it is preferably at least 1 nm. It is noted that the average particle size is determined as a weight average diameter $D_{50}$ (particle diameter at 50% by weight cumulative, or median diameter) upon measurement of particle size distribution by laser light diffractometry.

The oxide of $R^2$, fluoride of $R^3$, and oxyfluoride of $R^4$ used herein are typically $R^2_2O_3$, $R^3F_3$, and $R^4OF$, respectively, although they generally refer to oxides containing $R^2$ and oxygen, fluorides containing $R^3$ and fluorine, and oxyfluorides containing $R^4$, oxygen and fluorine, additionally including $R^2O_n$, $R^3F_n$, and $R^4O_mF_n$ wherein m and n are arbitrary positive numbers, and modified forms in which part of $R^2$, $R^3$ or $R^4$ is substituted or stabilized with another metal element as long as they can achieve the benefits of the invention.

The powder disposed on the magnet surface contains the oxide of $R^2$, fluoride of $R^3$, oxyfluoride of $R^4$ or a mixture thereof, and may additionally contain at least one member selected from among a carbide, nitride, hydroxide and hydride of $R^5$ or a mixture or composite thereof wherein $R^5$ is one or more elements selected from among rare earth elements inclusive of Y and Sc. In case of using a fluoride of $R^3$ and/or an oxyfluoride of $R^4$, an oxide of $R^5$ may additionally be contained. Further, the powder may contain a fine powder of boron, boron nitride, silicon, carbon or the like, or an organic compound such as stearic acid in order to promote the dispersion or chemical/physical adsorption of the powder. In order for the invention to attain its effect efficiently, the powder should contain at least 10% by weight, preferably at least 20% by weight of the oxide of $R^2$, fluoride of $R^3$, oxyfluoride of $R^4$ or a mixture thereof. It is recommended that the oxide of $R^2$, fluoride of $R^3$ or oxyfluoride of $R^4$ as the main component account for at least 50% by weight, more preferably at least 70% by weight, and even more preferably at least 90% by weight based on the entire powder.

After the powder comprising the oxide of $R^2$, fluoride of $R^3$, oxyfluoride of $R^4$ or a mixture thereof is disposed on the magnet surface, the magnet and the powder are heat treated in vacuum or in an atmosphere of an inert gas such as argon (Ar) or helium (He). This treatment is referred to as absorption treatment, hereinafter. The temperature of absorption treatment is equal to or below the sintering temperature of the magnet form. The treatment temperature is limited for the following reason.

If treatment is done at a temperature above the sintering temperature (designated Ts in ° C.) of the relevant sintered magnet, there arise problems like (1) the sintered magnet alters its structure and fails to provide excellent magnetic properties; (2) the sintered magnet fails to maintain its dimensions as machined due to thermal deformation; and (3) the diffusing R can diffuse into the interior of magnet grains beyond the grain boundaries in the magnet, resulting in a reduced remanence. The treatment temperature should thus be equal to or below the sintering temperature, and preferably equal to or below (Ts-10)° C. The lower limit of temperature, which may be selected as appropriate, is typically at least 350° C. The time of absorption treatment is from 1 minute to 100 hours. The absorption treatment is not completed within less than 1 minutes whereas more than 100 hours of treatment gives rise to the problems that the sintered magnet alters its structure and the inevitable oxidation and evaporation of components adversely affect the magnetic properties. The more preferred time is 5 minutes to 8 hours, especially 10 minutes to 6 hours.

Through the absorption treatment described above, $R^2$, $R^3$ or $R^4$ which has been contained in the powder disposed on the magnet surface is transferred and concentrated in the rare earth-rich grain boundary phase component within the magnet where $R^2$, $R^3$ or $R^4$ substitutes near the surface layer of $R_2Fe_{14}B$ primary phase grains. In the event the powder contains the fluoride of $R^3$ or oxyfluoride of $R^4$, part of the fluorine contained in the powder is absorbed in the magnet along with the $R^3$ or $R^4$, substantially facilitating the supply of $R^3$ or $R^4$ from the powder and the diffusion of $R^3$ or $R^4$ at grain boundaries in the magnet.

The rare earth element contained in the oxide of $R^2$, fluoride of $R^3$, or oxyfluoride of $R^4$ is one or more elements selected from rare earth elements inclusive of Y and Sc. Since the elements which are most effective in enhancing crystal magnetic anisotropy when concentrated at the surface layer are dysprosium and terbium, it is preferred that Dy and Tb be contained in the powder in a total amount of at least 10 atom % based on the rare earth elements, with a total amount of at least 20 atom % being more preferred. It is also preferred that the total concentration of Nd and Pr in $R^2$, $R^3$ and $R^4$ be lower than the total concentration of Nd and Pr in $R^1$.

As a result of the absorption treatment, the coercive force of the R—Fe—B sintered magnet is efficiently increased without entailing a substantial loss of remanence.

The absorption treatment can be conducted by, for example, putting the sintered magnet form in a slurry obtained by dispersing the powder in water or an organic solvent to dispose the powder on the surface of the sintered magnet form, and then effecting heat treatment. In the absorption treatment, the magnets are covered with the powder so that the magnets are kept apart, preventing the magnets from being fused together after the absorption treatment albeit high temperature. Additionally, the powder is not bonded to the magnets after the heat treatment. This permits a number of magnets to be placed in a container for heat treatment therein, indicating that the preparation method of the invention is also improved in productivity.

Also preferably, the absorption treatment is followed by aging treatment. The aging treatment is desirably at a temperature which is below the absorption treatment temperature, preferably from 200° C. to a temperature lower than the absorption treatment temperature by 10° C., and more preferably from 350° C. to a temperature lower than the absorption treatment temperature by 10° C. The atmosphere is preferably vacuum or an inert gas such as Ar or He. The time of aging treatment is from 1 minute to 10 hours, preferably from 10 minutes to 5 hours, and more preferably from 30 minutes to 2 hours.

It is noted for the machining of the sintered magnet form before disposing the powder on the sintered magnet form that if the coolant used in the machining tool is aqueous, or if the surface being machined is exposed to high temperature during the machining, there is a likelihood of an oxide film forming on the machined surface, which oxide film can inhibit the absorption reaction of $R^2$, $R^3$ or $R^4$ component from the powder to the magnet form. In such a case, the oxide film is removed by cleaning with at least one of alkalis, acids and organic solvents or by shot blasting before adequate absorption treatment is carried out.

Examples of the alkali used herein include potassium pyrophosphate, sodium pyrophosphate, potassium citrate, sodium citrate, potassium acetate, sodium acetate, potassium oxalate, sodium oxalate, etc. Examples of the acid used herein include hydrochloric acid, nitric acid, sulfuric acid, acetic acid, citric acid, tartaric acid, etc. Examples of the organic solvent used herein include acetone, methanol, ethanol, isopropyl alcohol, etc. Herein, the alkali or acid may be used as an aqueous solution having an appropriate concentration not to attack the magnet form.

Further, a surface layer of the sintered magnet form may be removed by shot blasting before disposing the powder.

The magnet, which has been subjected to the absorption treatment and optionally, subsequent aging treatment, may be again cleaned with at least one of alkalis, acids and organic solvents or machined to a practical shape. Moreover, the process including absorption treatment, aging treatment, and cleaning or machining may further include subsequent plating or painting.

The permanent magnet material thus obtained finds use as a high-performance, compact or thin permanent magnet having an increased coercive force.

EXAMPLE

Examples are given below for illustrating the present invention, but the scope of the invention is not limited thereby. In Examples, the filling factor of dysprosium oxide or dysprosium fluoride in the magnet surface-surrounding space is calculated from a weight gain of the magnet after powder treatment and the true density of powder material.

Example 1 and Comparative Examples 1-2

A thin plate of alloy was prepared by a so-called strip casting technique, specifically by weighing predetermined amounts of Nd, Co, Al and Fe metals having a purity of at least 99% by weight and ferroboron, induction heating in an argon atmosphere for melting, and casting the alloy melt on a copper single roll in an argon atmosphere. The resulting alloy had a composition of 13.5 atom % Nd, 1.0 atom % Co, 0.5 atom % Al, 5.8 atom % B, and the balance of Fe and is designated Alloy A. Alloy A was hydrided and then heated at 500° C. for partial dehydriding while evacuating to vacuum. By this so-called hydriding pulverization, the alloy was pulverized into a coarse powder having a size of up to 30 mesh. Another alloy was prepared by weighing predetermined amounts of Nd, Tb, Fe, Co, Al and Cu metals having a purity of at least 99% by weight and ferroboron, induction heating in an argon atmosphere for melting, and casting. The resulting alloy had a composition of 20 atom % Nd, 10 atom % Tb, 24 atom % of Fe, 6 atom % B, 1 atom % of Al, 2 atom % of Cu, and the balance of Co and is designated Alloy B. Using a Brown mill in a nitrogen atmosphere, Alloy B was coarsely pulverized to a size of up to 30 mesh.

Subsequently, Alloy A powder and Alloy B powder were weighed in amounts of 90% and 10% by weight, respectively, and mixed together on a V blender which had been purged with nitrogen. On a jet mill using high-pressure nitrogen gas, the mixed powder was finely pulverized to a mass median particle diameter of 4 μm. The mixed fine powder was compacted in a nitrogen atmosphere under a pressure of about 1 ton/cm$^2$ while being oriented in a magnetic field of 15 kOe. The compact was then placed in a sintering furnace in an argon atmosphere where it was sintered at 1,060° C. for 2 hours, obtaining a magnet block dimensioned 10 mm×20 mm×15 mm (thick). Using a diamond cutter, the magnet block was machined on all the surfaces to 4 mm×4 mm×0.5 mm (magnetic anisotropy direction).

The machined magnet form was cleaned with an alkaline solution, cleaned with acids and dried. Steps of rinsing with deionized water were included before and after each cleaning step.

Subsequently, dysprosium fluoride having an average particle size of 5 μm was mixed with ethanol at a weight fraction of 50%, in which the magnet form was immersed for one minute with ultrasonic waves being applied. The magnet form was pulled up and immediately dried with hot air. At this point, the filling factor of dysprosium fluoride in the magnet surface-surrounding space was 45%. The magnet form was subjected to absorption treatment in an argon atmosphere at 900° C. for one hour, then to aging treatment at 500° C. for one hour, and quenched, obtaining a magnet form designated M1. For comparison purposes, a magnet form designated P1 was prepared by subjecting it to only heat treatment.

Figure 1:
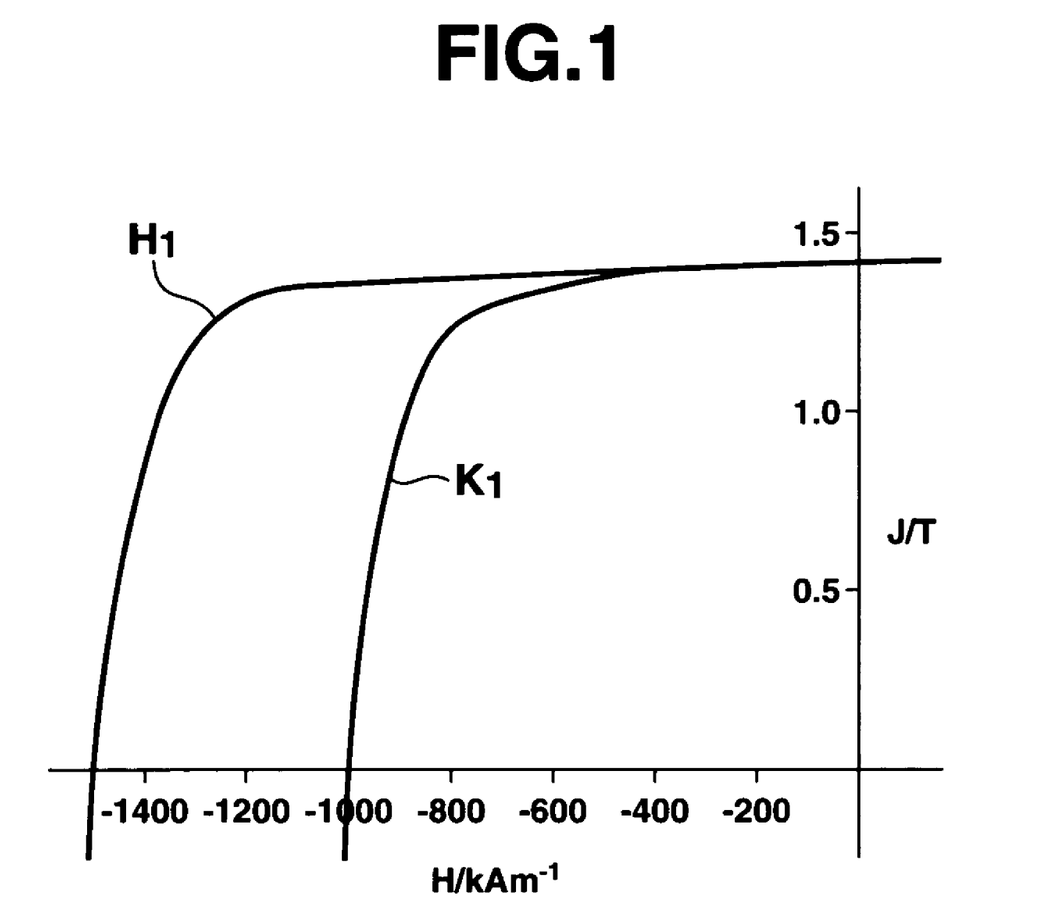
FIG. 1 is a graph showing a demagnetization curve (curve H1) of a magnet form M1 which is prepared by the invention and a demagnetization curve (curve K1) of a magnet form P1 which is prepared only by machining and heat treatment.
Figure 2A:
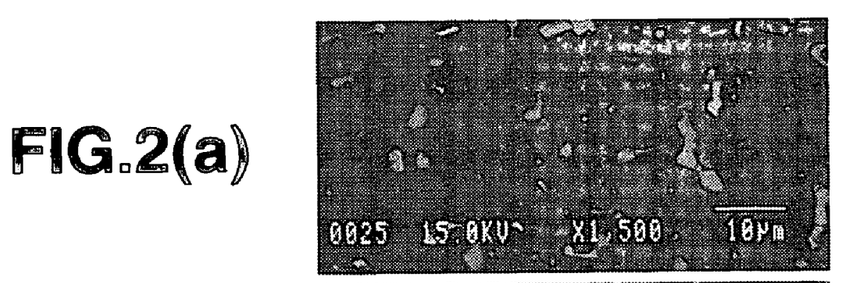
Figure 2B:
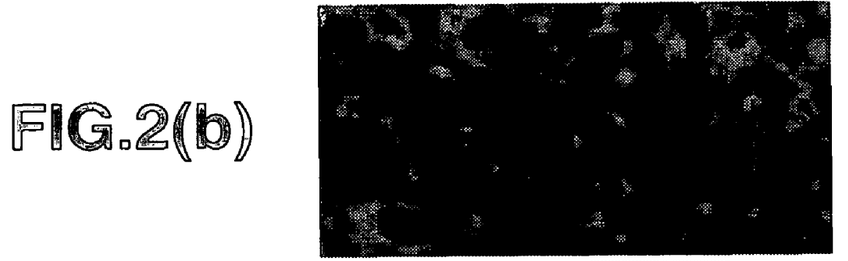
Figure 2C:
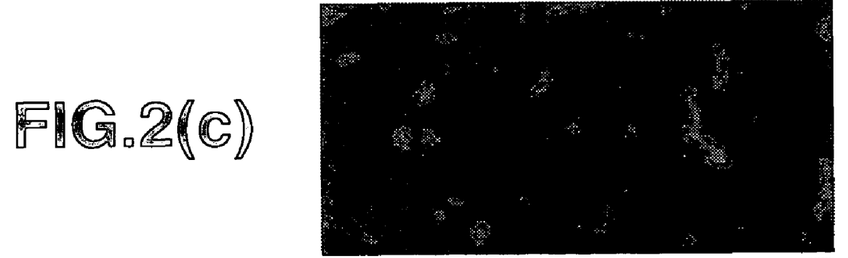
Figure 2D:
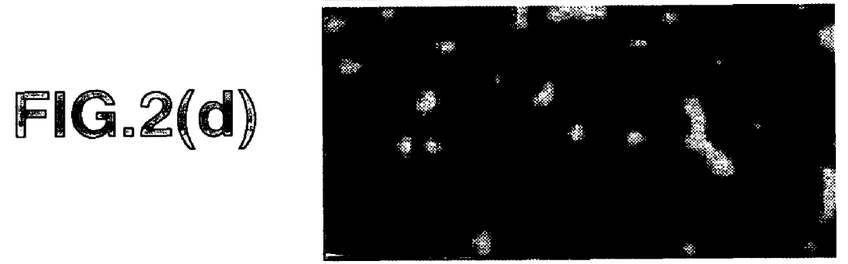
Figure 2E:
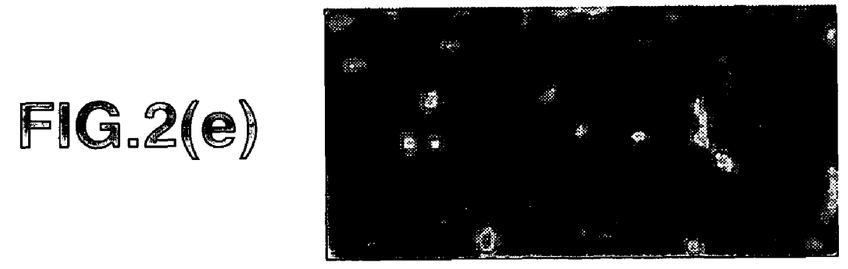

In FIG. 1, demagnetization curves of magnet forms M1 and P1 are depicted as curves H1 and K1, respectively, and their magnetic properties are shown in Table 1. The inventive magnet was found to offer an increase in coercive force of 500 kAm$^{-1}$ relative to the coercive force of the magnet P1 which had not been subjected to dysprosium absorption treatment. A drop of remanence was 5 mT.

For comparison purposes, a magnet was prepared using an alloy composition in which part of Nd in Alloy A was substituted with Dy. This magnet was designed to achieve an increase in coercive force of 500 kAm$^{-1}$, but its remanence dropped by 50 mT. The magnetic properties of this magnet form P2 are also shown in Table 1.

FIG. 2 illustrates a reflection electron image under SEM, and compositional images of Dy, Nd, F and O by EPMA of the magnet form M1. Since the magnet before the treatment does not contain Dy and F, the presence of Dy and F in FIG. 2 is attributed to the absorption treatment of the invention. Dysprosium absorbed is concentrated only in proximity to grain boundaries while fluorine (F) is also present at grain boundaries and bonds with oxides, which are contained as incidental impurities within the magnet before the treatment, to form oxyfluorides. This distribution of Dy enables to increase the coercive force while minimizing a drop of remanence.

Example 2

By the same procedure as in Example 1, a magnet form of 20 mm×30 mm×3 mm was prepared.

Dysprosium oxyfluoride having an average particle size of 10 μm was mixed with ethanol at a weight fraction of 50%, in which the magnet form was immersed for one minute with ultrasonic waves being applied. The magnet form was pulled up and immediately dried with hot air. At this point, the filling factor of dysprosium oxyfluoride in the magnet surface-surrounding space was 45%. The magnet form was subjected to absorption treatment in an argon atmosphere at 900° C. for one hour, then to aging treatment at 500° C. for one hour, and quenched, obtaining a magnet form designated M2.

The magnetic properties of magnet form M2 are also shown in Table 1. The inventive magnet was found to offer an increase in coercive force of 470 kAm$^{-1}$ relative to the coercive force of the magnet P1 which had not been subjected to dysprosium absorption treatment. A drop of remanence was 3 mT.

Example 3

By the same procedure as in Example 1, a magnet form of 10 mm×20 mm×1.5 mm was prepared.

Terbium fluoride having an average particle size of 5 μm was mixed with ethanol at a weight fraction of 50%, in which the magnet form was immersed for one minute with ultrasonic waves being applied. The magnet form was pulled up and immediately dried with hot air. At this point, the filling factor of terbium fluoride in the magnet surface-surrounding space was 45%. The magnet form was subjected to absorption treatment in an argon atmosphere at 900° C. for one hour, then to aging treatment at 500° C. for one hour, and quenched, obtaining a magnet form designated M3.

The magnetic properties of magnet form M3 are also shown in Table 1. The inventive magnet was found to offer an increase in coercive force of 800 kAm$^{-1}$ relative to the coercive force of the magnet P1 which had not been subjected to terbium absorption treatment. A drop of remanence was 5 mT.

Example 4 and Comparative Example 3

A thin plate of alloy was prepared by a so-called strip casting technique, specifically by weighing predetermined amounts of Nd, Co, Al, Fe and Cu metals having a purity of at least 99% by weight and ferroboron, induction heating in an argon atmosphere for melting, and casting the alloy melt on a copper single roll in an argon atmosphere. The resulting alloy had a composition of 13.5 atom % Nd, 1.0 atom % Co, 0.5 atom % Al, 0.2 atom % of Cu, 5.9 atom % B, and the balance of Fe. The alloy was hydrided and then heated to 500° C. for partial dehydriding while evacuating to vacuum. By this so-called hydriding pulverization, the alloy was pulverized into a coarse powder having a size of up to 30 mesh.

On a jet mill using high-pressure nitrogen gas, the coarse powder was finely pulverized to a mass median particle diameter of 4 μm. The resulting fine powder was compacted in a nitrogen atmosphere under a pressure of about 1 ton/cm$^2$ while being oriented in a magnetic field of 15 kOe. The compact was then placed in a sintering furnace in an argon atmosphere where it was sintered at 1,060° C. for 2 hours, obtaining a magnet block dimensioned 10 mm×20 mm×15 mm (thick). Using a diamond cutter, the magnet block was machined on all the surfaces to 20 mm×4 mm×1 mm.

The machined magnet form was cleaned with an alkaline solution, cleaned with acids and dried. Steps of rinsing with deionized water were included before and after each cleaning step.

Subsequently, terbium fluoride having an average particle size of 5 μm was mixed with ethanol at a weight fraction of 50%, in which the magnet form was immersed for one minute with ultrasonic waves being applied. The magnet form was pulled up and immediately dried with hot air. At this point, the filling factor of terbium fluoride in the magnet surface-surrounding space was 45%. The magnet form was subjected to absorption treatment in an argon atmosphere at 900° C. for one hour, then to aging treatment at 500° C. for one hour, and quenched, obtaining a magnet form designated M4. For comparison purposes, a magnet form designated P3 was prepared by subjecting it to only heat treatment.

The magnetic properties of magnet forms M4 and P3 are also shown in Table 1. The inventive magnet was found to offer an increase in coercive force of 800 kAm$^{-1}$ relative to the coercive force of the magnet P3 which had not been subjected to terbium absorption treatment. A drop of remanence was 5 mT.

TABLE 1

|  |  | Br (T) | HcJ (kAm$^{-1}$) | (BH)max (kJm$^{-3}$) |
|---|---|---|---|---|
| Example 1 | M1 | 1.415 | 1,500 | 390 |
| Example 2 | M2 | 1.417 | 1,470 | 393 |
| Example 3 | M3 | 1.415 | 1,800 | 390 |
| Example 4 | M4 | 1.445 | 1,600 | 407 |
| Comparative Example 1 | P1 | 1.420 | 1,000 | 395 |
| Comparative Example 2 | P2 | 1.370 | 1,500 | 368 |
| Comparative Example 3 | P3 | 1.450 | 800 | 412 |

Example 5 and Comparative Examples 4-5

A thin plate of alloy was prepared by a so-called strip casting technique, specifically by weighing predetermined amounts of Nd, Co, Al and Fe metals having a purity of at least 99% by weight and ferroboron, induction heating in an argon atmosphere for melting, and casting the alloy melt on a copper single roll in an argon atmosphere. The resulting alloy had a composition of 13.5 atom % Nd, 1.0 atom % Co, 0.5 atom % Al, 5.8 atom % B, and the balance of Fe, and is designated Alloy C. Alloy C was hydrided and then heated at 500° C. for partial dehydriding while evacuating to vacuum. By this so-called hydriding pulverization, the alloy was pulverized into a coarse powder having a size of up to 30 mesh. Another alloy was prepared by weighing predetermined amounts of Nd, Tb, Fe, Co, Al and Cu metals having a purity of at least 99% by weight and ferroboron, induction heating in an argon atmosphere for melting, and casting. The resulting alloy had a composition of 20 atom % Nd, 10 atom % Tb, 24 atom % of Fe, 6 atom % B, 1 atom % of Al, 2 atom % of Cu, and the balance of Co, and is designated Alloy D. Using a Brown mill in a nitrogen atmosphere, Alloy D was coarsely pulverized to a size of up to 30 mesh.

Subsequently, Alloy C powder and Alloy D powder were weighed in amounts of 90% and 10% by weight, respectively, and mixed together on a V blender which had been purged with nitrogen. On a jet mill using high-pressure nitrogen gas, the mixed powder was finely pulverized to a mass median particle diameter of 4 μm. The mixed fine powder was compacted in a nitrogen atmosphere under a pressure of about 1 ton/cm$^2$ while being oriented in a magnetic field of 15 kOe. The compact was then placed in a sintering furnace in an argon atmosphere where it was sintered at 1,060° C. for 2 hours, obtaining a magnet block dimensioned 10 mm×20 mm×15 mm (thick). Using a diamond cutter, the magnet block was machined on all the surfaces to 4 mm×4 mm×0.5 mm (magnetic anisotropy direction).

The machined magnet form was cleaned with an alkaline solution, cleaned with acids and dried. Steps of rinsing with deionized water were included before and after each cleaning step.

Subsequently, dysprosium oxide having an average particle size of 1 μm was mixed with ethanol at a weight fraction of 50%, in which the magnet form was immersed for one minute with ultrasonic waves being applied. The magnet form was pulled up and immediately dried with hot air. At this point, the filling factor of dysprosium oxide in the magnet surface-surrounding space was 50%. The magnet form was subjected to absorption treatment in an argon atmosphere at 900° C. for one hour, then to aging treatment at 500° C. for one hour, and quenched, obtaining a magnet form designated M5. For comparison purposes, a magnet form designated P4 was prepared by subjecting it to only heat treatment.

Figure 3:
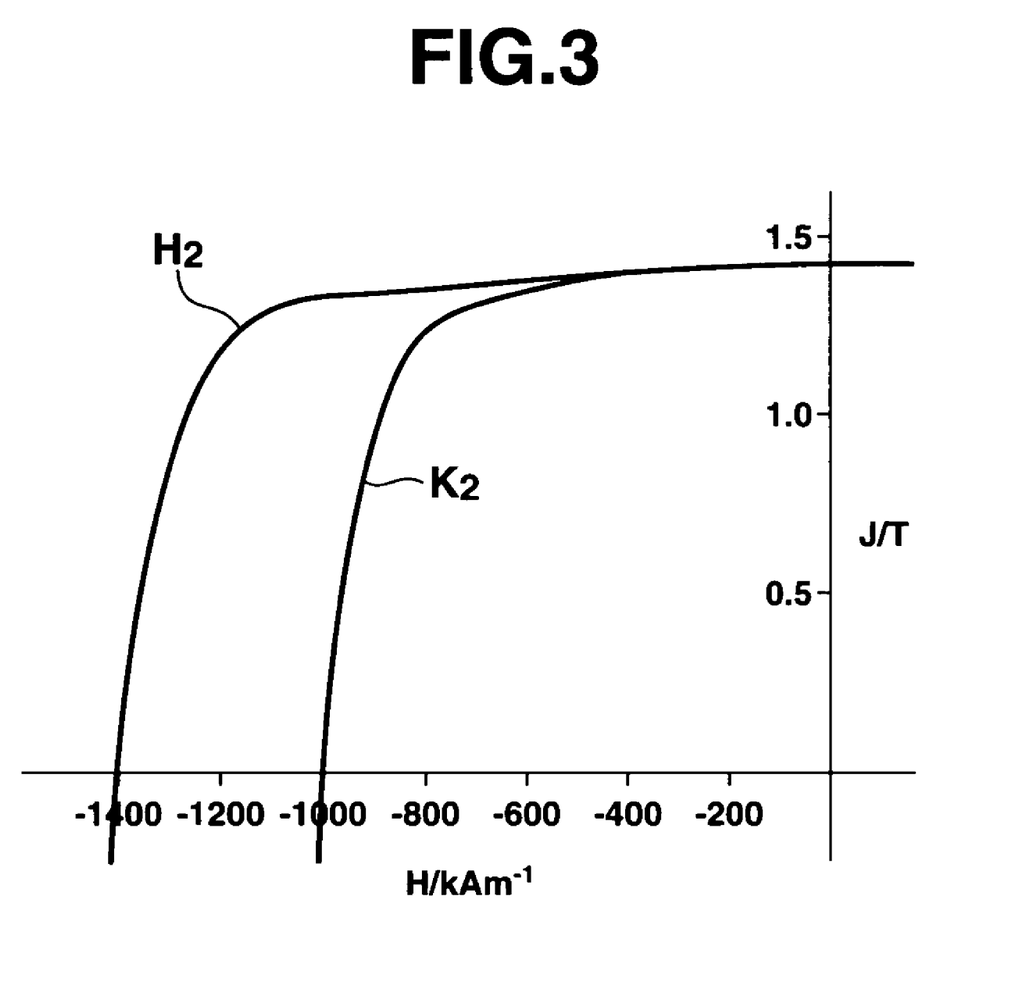
FIG. 3 is a graph showing a demagnetization curve (curve H2) of a magnet form M5 which is prepared by the invention and a demagnetization curve (curve K2) of a magnet form P4 which is prepared only by machining and heat treatment.

In FIG. 3, demagnetization curves of magnet forms M5 and P4 are depicted as curves H2 and K2, respectively, and their magnetic properties are shown in Table 2. The inventive magnet was found to offer an increase in coercive force of 400 kAm$^{-1}$ relative to the coercive force of the magnet P4 which had not been subjected to dysprosium absorption treatment. No drop of remanence was found.

In Comparative Example 5, a magnet was prepared as in Example 5 aside from using an alloy composition in which part of Nd in Alloy C was substituted with Dy and omitting the absorption treatment. This magnet was designed to achieve an increase in coercive force of 400 kAm$^{-1}$, but its remanence dropped by 40 mT. The magnetic properties of this magnet form P5 are also shown in Table 2.

TABLE 2

|  |  | Br (T) | HcJ (kAm$^{-1}$) | (BH)max (kJm$^{-3}$) |
|---|---|---|---|---|
| Example 5 | M5 | 1.420 | 1,400 | 395 |
| Comparative Example 4 | P4 | 1.420 | 1,000 | 395 |
| Comparative Example 5 | P5 | 1.380 | 1,400 | 375 |

The invention claimed is:

1. A method for preparing a rare earth permanent magnet material comprising the steps of:

disposing a powder comprising an oxide of $R^2$, wherein $R^2$ is one or more elements selected from among rare earth elements inclusive of Y and Sc on a sintered magnet form of a $R^1$—Fe—B composition wherein $R^1$ is one or more elements selected from among rare earth elements inclusive of Y and Sc, said sintered magnet form having a dimension of at least 0.5 mm in a magnetic anisotropy direction, and heat treating the magnet form and the powder at a temperature equal to or below the sintering temperature of the magnet in vacuum or in an inert gas, wherein said powder comprising an oxide of $R^2$ having an average particle size of up to 100 μm is disposed in the surface of the magnet form as a slurry thereof dispersed in an aqueous or organic solvent.

2. A method for preparing a rare earth permanent magnet material according to claim 1, wherein the sintered magnet form to be heat treated has a shape having a dimension of up to 100 mm along its maximum side and a dimension of up to 10 mm in a magnetic anisotropy direction.

3. A method for preparing a rare earth permanent magnet material according to claim 1, wherein the powder comprising an oxide of $R^2$ is present in a magnet-surrounding space within a distance of 1 mm from the surface of the magnet form and at an average filling factor of at least 10%.

4. A method for preparing a rare earth permanent magnet material according to claim 1, wherein the powder comprising an oxide of $R^2$ has an average particle size of up to 100 μm.

5. A method for preparing a rare earth permanent magnet material according to claim 1, wherein $R^2$ contains at least 10 atom % of Dy and/or Tb.

6. A method for preparing a rare earth permanent magnet material according to claim 1, further comprising, after the heat treatment, effecting aging treatment at a temperature from 350° C. to a temperature lower than the temperature of the heat treatment.

7. A method for preparing a rare earth permanent magnet material according to claim 1, wherein the sintered magnet form is cleaned with at least one of alkalis, acids and organic solvents before the step of disposing the powder on the surface of the magnet form, and then effecting the heat treatment.

8. A method for preparing a rare earth permanent magnet material according to claim 1, wherein a surface layer of the sintered magnet form is removed by shot blasting before the step of disposing the powder on the surface of the magnet form, and then effecting the heat treatment.

9. A method for preparing a rare earth permanent magnet material according to claim 1, wherein cleaning with at least one of alkalis, acids and organic solvents, grinding, or plating or painting is carried out as a final treatment after the heat treatment.

10. A method for preparing a rare earth permanent magnet material according to claim 1, wherein said sintered magnet has a dimension of 4 to 100 mm along its maximum side.

11. A method for preparing a rare earth permanent magnet material according to claim 1, wherein the sintered magnet form to be heat treated has a shape having a dimension of 0.5 to 10 mm in a magnetic anisotropy direction.

12. A method for preparing a rare earth permanent magnet material according to claim 1, wherein the sintered magnet form to be heat treated is obtained by compacting and sintering powder of a mother alloy containing $R^1$, Fe and B, and machining the thus obtained sintered block to a shape having a dimension of 4 to 100 mm along its maximum side and a dimension of up to 10 mm in a magnetic anisotropy direction.

* * * * *